US007609562B2

(12) United States Patent
Sundaram

(10) Patent No.: US 7,609,562 B2
(45) Date of Patent: Oct. 27, 2009

(54) CONFIGURABLE DEVICE ID IN NON-VOLATILE MEMORY

(75) Inventor: Rajesh Sundaram, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 16 days.

(21) Appl. No.: 11/701,302

(22) Filed: Jan. 31, 2007

(65) Prior Publication Data

US 2008/0181043 A1 Jul. 31, 2008

(51) Int. Cl.
G11C 16/04 (2006.01)
G11C 7/22 (2006.01)
G11C 7/10 (2006.01)
G06F 12/06 (2006.01)

(52) U.S. Cl. .................. 365/185.33; 365/189.011; 365/189.02; 711/5

(58) Field of Classification Search ............ 365/185.11, 365/185.33
See application file for complete search history.

(56) References Cited

U.S. PATENT DOCUMENTS

| | | | | | |
|---|---|---|---|---|---|
| 4,949,242 | A | * | 8/1990 | Takeuchi et al. ............. | 711/219 |
| 5,289,113 | A | * | 2/1994 | Meaney et al. ............. | 324/73.1 |
| 5,390,308 | A | * | 2/1995 | Ware et al. ................. | 711/5 |
| 5,493,531 | A | * | 2/1996 | Pascucci et al. ............. | 365/200 |
| 5,548,559 | A | * | 8/1996 | Mochizuki et al. ........ | 365/230.08 |
| 5,619,453 | A | * | 4/1997 | Roohparvar et al. ... | 365/185.33 |
| 5,860,080 | A | * | 1/1999 | James et al. ................. | 711/4 |
| 5,867,444 | A | * | 2/1999 | Le et al. ................. | 365/230.06 |
| 5,956,349 | A | * | 9/1999 | Watanabe et al. ........... | 714/718 |
| 5,983,320 | A | * | 11/1999 | Farmwald et al. ........... | 711/114 |
| 6,047,352 | A | * | 4/2000 | Lakhani et al. .............. | 711/5 |
| 6,175,891 | B1 | * | 1/2001 | Norman et al. ............... | 711/5 |
| 6,366,521 | B1 | * | 4/2002 | Roohparvar ............... | 365/226 |
| 6,421,765 | B1 | * | 7/2002 | Poisner ..................... | 711/145 |
| 6,519,691 | B2 | * | 2/2003 | Lakhani et al. ............ | 711/218 |
| 6,535,450 | B1 | * | 3/2003 | Ryan et al. ............. | 365/230.03 |
| 6,567,335 | B1 | * | 5/2003 | Norman et al. ........ | 365/230.06 |
| 6,571,311 | B2 | * | 5/2003 | Kuwano ..................... | 711/103 |
| 6,684,314 | B1 | * | 1/2004 | Manter ...................... | 711/200 |
| 6,801,989 | B2 | * | 10/2004 | Johnson et al. ............. | 711/167 |
| 6,820,179 | B2 | * | 11/2004 | Kobayashi et al. .......... | 711/156 |
| 6,944,064 | B2 | * | 9/2005 | Feng et al. ............. | 365/189.18 |
| 6,965,923 | B2 | * | 11/2005 | Norman et al. ............. | 709/214 |
| 6,973,519 | B1 | * | 12/2005 | Estakhri et al. ............. | 710/104 |
| 7,215,004 | B1 | * | 5/2007 | Nataraj ........................ | 257/536 |
| 7,308,524 | B2 | * | 12/2007 | Grundy et al. .............. | 711/103 |
| 2005/0157553 | A1 | * | 7/2005 | Perroni et al. .......... | 365/185.11 |
| 2008/0198682 | A1 | * | 8/2008 | Pyeon ................... | 365/230.06 |

* cited by examiner

*Primary Examiner*—Son L Mai
(74) *Attorney, Agent, or Firm*—John F. Travis; Intel Corporation

(57) ABSTRACT

Various embodiments of the invention may use one or more programmable non-volatile registers in each memory device to provide a separate device address for that device. These registers may be programmed at various points in the manufacturing and distribution cycle, such as but not limited to the memory chip factory, an original equipment manufacturer (OEM), or in the field. In some embodiments, other types of information (e.g., configuration information for the memory device) may also be programmed in this manner.

9 Claims, 5 Drawing Sheets

CONFIGURABLE DEVICE ID IN NON-VOLATILE MEMORY

BACKGROUND

In a memory system, an array of addressable memory cells may be placed into a single die, and then multiple such dice may be arranged in a package (such as a dual inline memory module, or DIMM) to provide a lot of storage in a compact package. To make the memory dice as cheaply as possible, every die may be identical when manufactured. In order to make each die in the package separately addressable, provisions must be made to assign a separate device address to each die. One common approach is to use a separate address decoder to convert a device address into a chip enable signal to the addressed die (with a separate chip enable line for each die). An alternate approach is to use a series of address straps that are physically configured external to each die in a way that allows each die to recognize only the address indicated by its individual strapping connections. Both approaches are relatively expensive to implement, both in manufacturing cost and in the physical space required.

BRIEF DESCRIPTION OF THE DRAWINGS

Some embodiments of the invention may be understood by referring to the following description and accompanying drawings that are used to illustrate embodiments of the invention. In the drawings.

DETAILED DESCRIPTION

Figure 1:
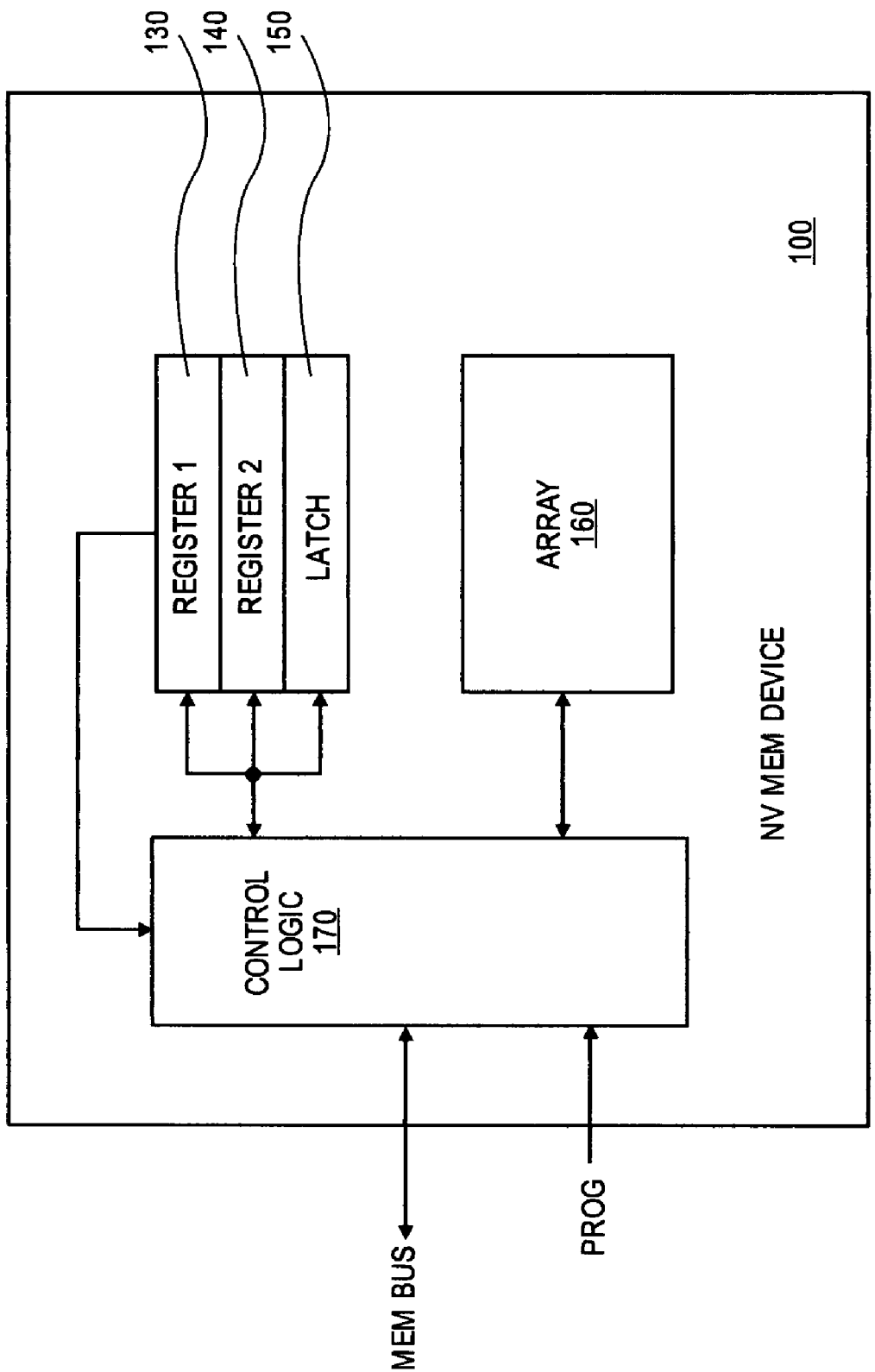
FIG. 1 shows a non-volatile memory device, according to an embodiment of the invention.

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

Various embodiments of the invention may be implemented in one or any combination of hardware, firmware, and software. The invention may also be implemented as instructions contained in or on a machine-readable medium, which may be read and executed by one or more processors to enable performance of the operations described herein. A machine-readable medium may include any mechanism for storing, transmitting, and/or receiving information in a form readable by a machine (e.g., a computer). For example, a machine-readable medium may include a storage medium, such as but not limited to read only memory (ROM); random access memory (RAM); magnetic disk storage media; optical storage media; a flash memory device, etc. A machine-readable medium may also include a propagated signal which has been modulated to encode the instructions, such as but not limited to electromagnetic, optical, or acoustical carrier wave signals.

Various embodiments of the invention may use one or more programmable non-volatile registers in each memory device to provide a separate device address for that device. These registers may be programmed at various points in the manufacturing and distribution cycle, such as but not limited to the memory chip factory or an original equipment manufacturer (OEM). In some embodiments the memory device, once it has been programmed with an address and placed in an operational system, may be reprogrammed with a different address while operating in that system. In some embodiments, other types of information (e.g., configuration information) may also be programmed into internal registers in this manner.

FIG. 1 shows a non-volatile (NV) memory device, according to an embodiment of the invention. In the embodiment shown, non-volatile memory device 100 may contain an array of non-volatile memory cells 160 to store data, and control logic 170 with an interface to a memory bus to control writing data into the array and reading data from the array, as well as controlling other operations that may be performed by the memory device 100. In some embodiments, the memory device 100 may be on a single integrated circuit, but other embodiments may use other techniques, such as multiple memory devices on a single integrated circuit, or a memory device distributed among multiple integrated circuits. In some embodiments, the memory device 100 may be implemented as a NAND flash memory device, but other embodiments may use other types of non-volatile technology.

The memory device 100 may include a programmable non-volatile register 130, and may also include one or more additional programmable non-volatile registers, such as register 140. In some embodiments the registers may be implemented using the same storage technology that is used in the memory cells of array 160. A latch 150 may be included to latch data before it is written into one of the registers, or after data is read out of one of the registers. At least one of these registers may be programmed to store a device address that identifies this particular memory device, so that when that particular device address is placed on the memory bus, comparison logic in the control logic 170 will recognize the address and this memory device will react to the command. If the device address on the memory bus is not the same as that in the address register, this memory device may ignore the command. In some embodiments, the address register 1 may be programmed through the use of a suitable command sequence on the memory bus, and/or through the use of a signal (e.g., PROG) on a programming pin on the memory device.

In some embodiments, a programming command sequence may be used if the memory device is in a circuit in which it can be unambiguously selected for programming without having to decode a unique device address. For example, a single memory device may be connected to a device that outputs a programming command sequence to the memory device. Similarly, multiple memory devices may be connected to a device that gives the same programming sequence to all of the memory devices at the same time, so that they all program themselves with the same device address. After programming, the memory devices can be separated and placed into separate memory systems, so that only one memory device per system has the same selection address.

In some embodiments, other information may be programmed into one or more of the registers. For example, configuration information for the operation of the memory device may be programmed into register 2. Once a device address has been placed into register 1, so that the memory device may be individually selected while in-circuit in a memory system, the configuration information may be programmed and modified as needed, even while in an operating computer system. Such configuration information may include, but is not limited to, such things as 1) bit-width, 2) erase block size, 3) page size, 4) etc.

Figure 2:
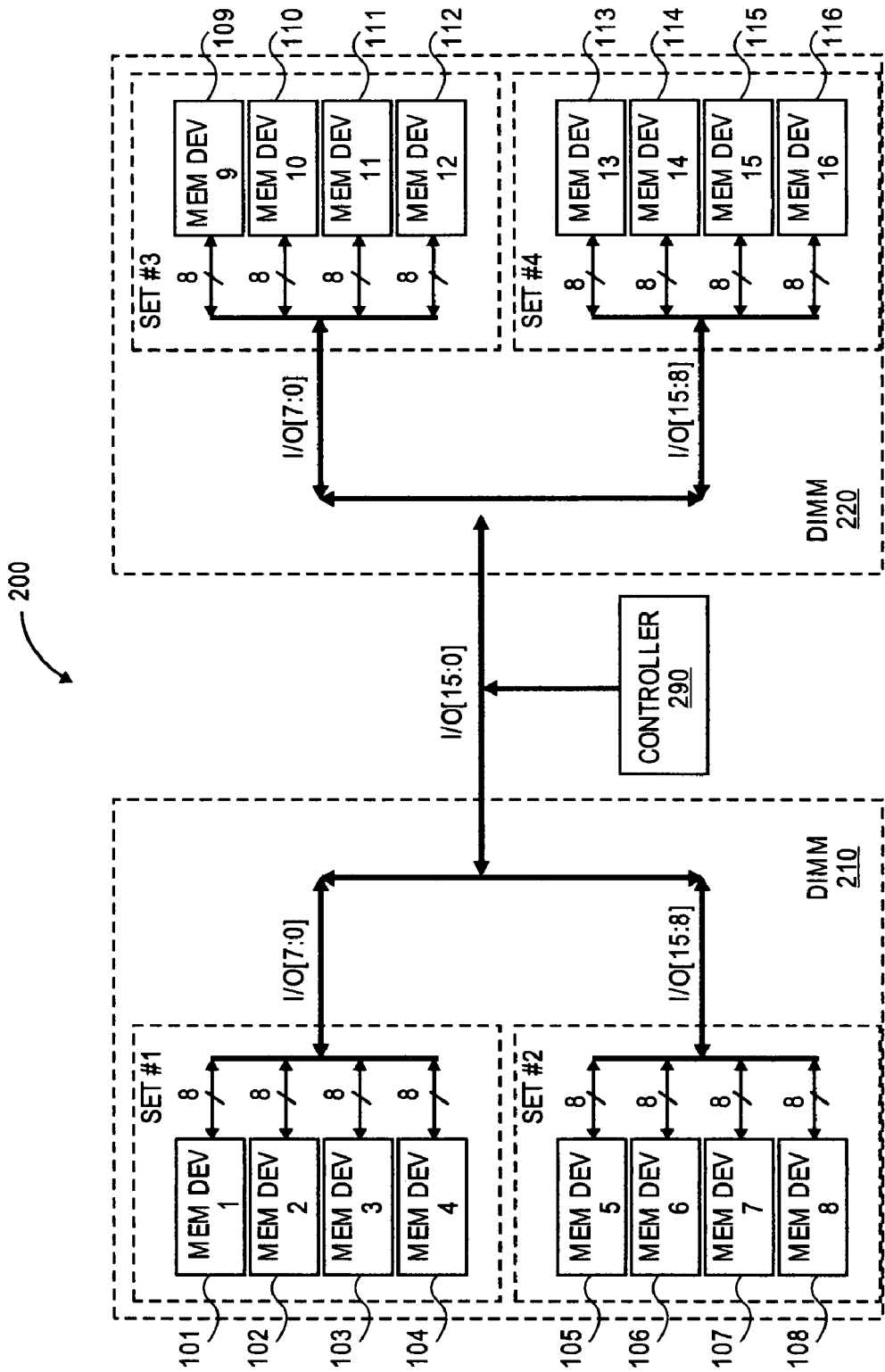
FIG. 2 shows a portion of a memory system, according to an embodiment of the invention.

FIG. 2 shows a portion of a memory system, according to an embodiment of the invention. In the illustrated embodiment, a memory system 200 contains multiple dual in-line memory modules (DIMM) 210, 220. Although only two DIMMs are shown, the system may contain any feasible number of DIMMs. Although DIMMs are shown, other embodiments may use other types of memory packaging. Each DIMM may contain a number of separate memory devices. In the example, each DIMM contains eight memory devices (101-108 in DIMM 210, 109-116 in DIMM 220), but other embodiments may contain more or fewer memory devices in each package. In some embodiments, each memory device may be similar to memory device 100 in FIG. 1, but other embodiments may contain memory devices that differ from memory device 100. The illustrated example also shows that the memory devices are separated into sets, with four memory devices per set and two sets per DIMM, but other embodiments may differ from this allocation of devices. A controller 290 may control data transfers into and out of each memory device over a memory bus, as well as controlling other operations in the memory system.

The illustrated example shows a 16-bit data width in the memory bus, but only an 8-bit data width for the individual memory devices. This mismatch may be accommodated by allocating the lower eight bits to one set of memory devices (e.g., 101-104 in DIMM 210, 109-112 in DIMM 220), and the higher eight bits to another set of memory devices (e.g., 105-108 in DIMM 210, 113-116 in DIMM 220). Other embodiments may use different techniques, such as but not limited to matching the bit-width of the memory bus to the bit-width of the memory devices.

Figure 3:
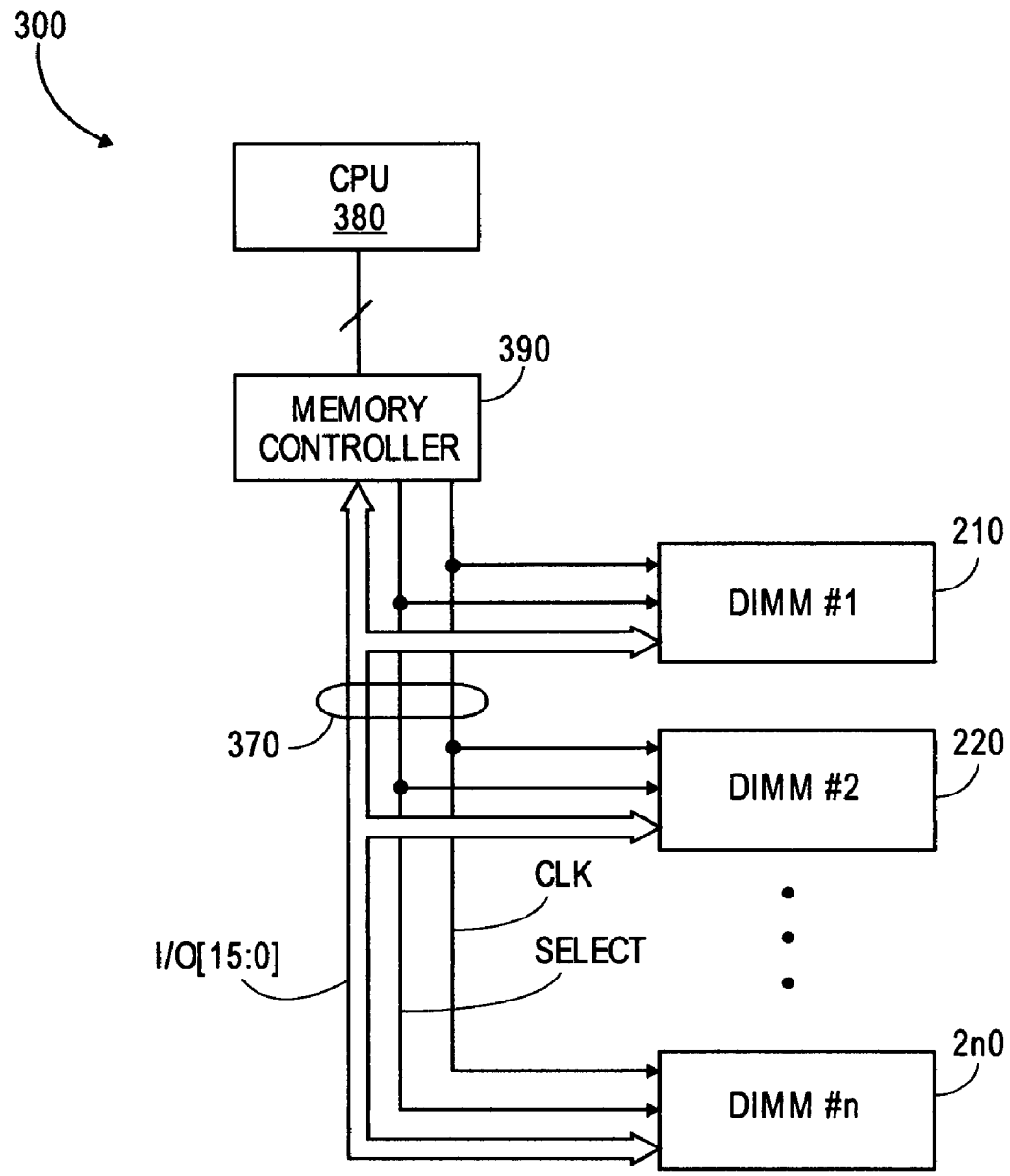
FIG. 3 shows a block diagram of a memory system, according to an embodiment of the invention.

FIG. 3 shows a block diagram of a memory system, according to an embodiment of the invention. In system 300, a central processing unit (CPU) 380 may be coupled to one or more memory controllers 390. The memory controller 390 may be coupled to a quantity n of memory modules, which are identified as 210, 220, . . . , through 2n0. Although the memory modules are labeled as dual inline memory modules (DIMM), any suitable type of memory modules may be used. The memory controller may communicate with the memory modules over a memory bus 370. The illustrated memory bus comprises 16 input/output lines I/O[15:0], a clock line CLK, and a selection line SELECT (which is explained in the description of FIG. 4), but other embodiments may comprise more, fewer, and/or different lines.

Figure 4:
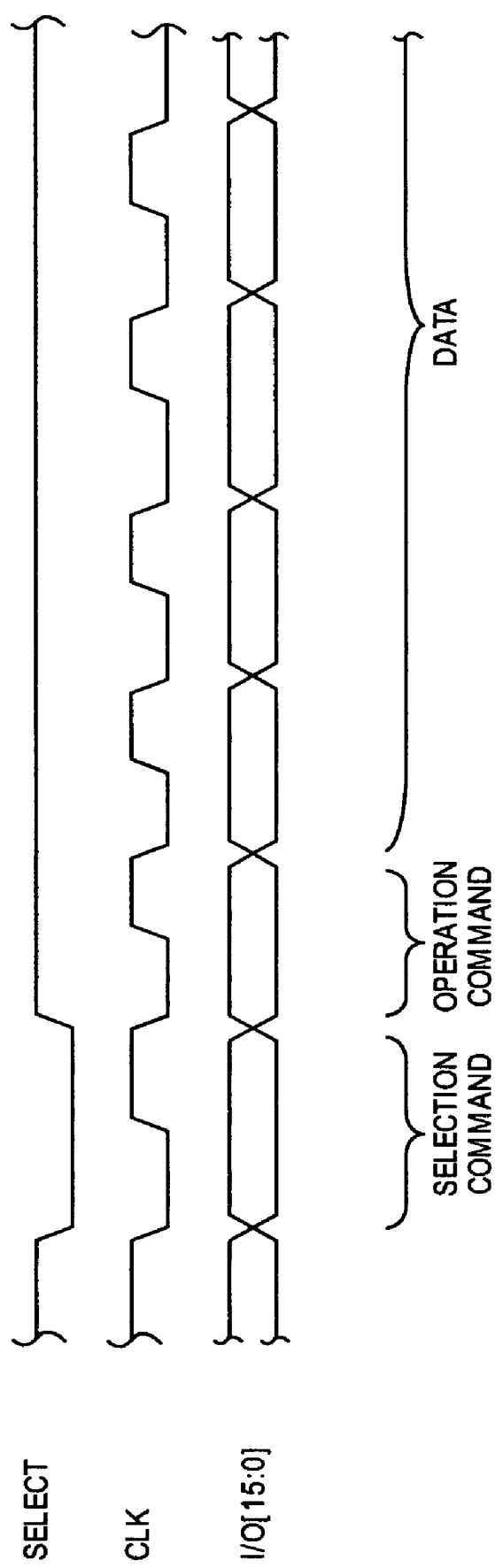
FIG. 4 shows a timing diagram of the memory bus shown in FIG. 3, according to embodiment of the invention.

FIG. 4 shows a timing diagram of the memory bus shown in FIG. 3, according to an embodiment of the invention. The clock line CLK provides a timing reference for the other signals on the bus. The particular example shown uses a low-to-high transition of the CLK line to latch data on the other lines, but other embodiments may use other conventions. The input/output lines I/O[15:0] may be used for multiple purposes, including issuing various types of commands and transferring data to or from the memory arrays. The first command in a command sequence may be a Selection command that identifies which memory device is being selected. The SELECT line may be asserted to identify that the input/output lines contain the selection information, and the selected memory device may then examine the input/output lines during the subsequent clock cycle to determine what operational command it is to follow. Depending on the specified operation, data on the input/output lines during the following clock cycles may be read, written, interpreted, etc. in a manner consistent with that operation. In the case of a data transfer operation command, a starting address within the array of the selected device(s) may be specified in the operation command, or in the first data cycle following the operation command, or in any other feasible part of the command sequence.

In some embodiments, this command sequence may be used to program an address into the memory device. For example, each memory device may be originally produced at the factory with a default selection address of 0000. Comparing this process to FIG. 4, each individual memory device may be placed in a programming system that issues a selection command with the address of 0000, followed by an operation command that instructs the memory device to program itself with a new device address, followed by data that specifies the address to be programmed into the memory device. Using its own internal write capability, the memory device can write this new address into the non-volatile register (e.g., register 130 in FIG. 1) that is dedicated for this purpose. From then on, the memory device will respond to selection commands that are directed to this new address. It may also be possible to later change the address again while the memory device is in an operational system. By simply repeating the above process, but addressing it to the current device address rather than to 0000, that device can overwrite its device address in register 130 and subsequently respond to its new address.

In other embodiments, other techniques may be used to program an address into the memory device. For example, a "Program" pin (shown FIG. 1) on the memory device may be dedicated to triggering a programming cycle.

Any of these programming techniques might also be used to program multiple memory devices with the same address at the same time. All of the multiple memory devices could be simultaneously selected, given a programming command or signal, and provided with the same new address over a common bus. Each memory device could then modify its own address register. In an assembly environment, these identically-addressed devices might then be distributed to identical locations in different systems that were under assembly.

Figure 5:
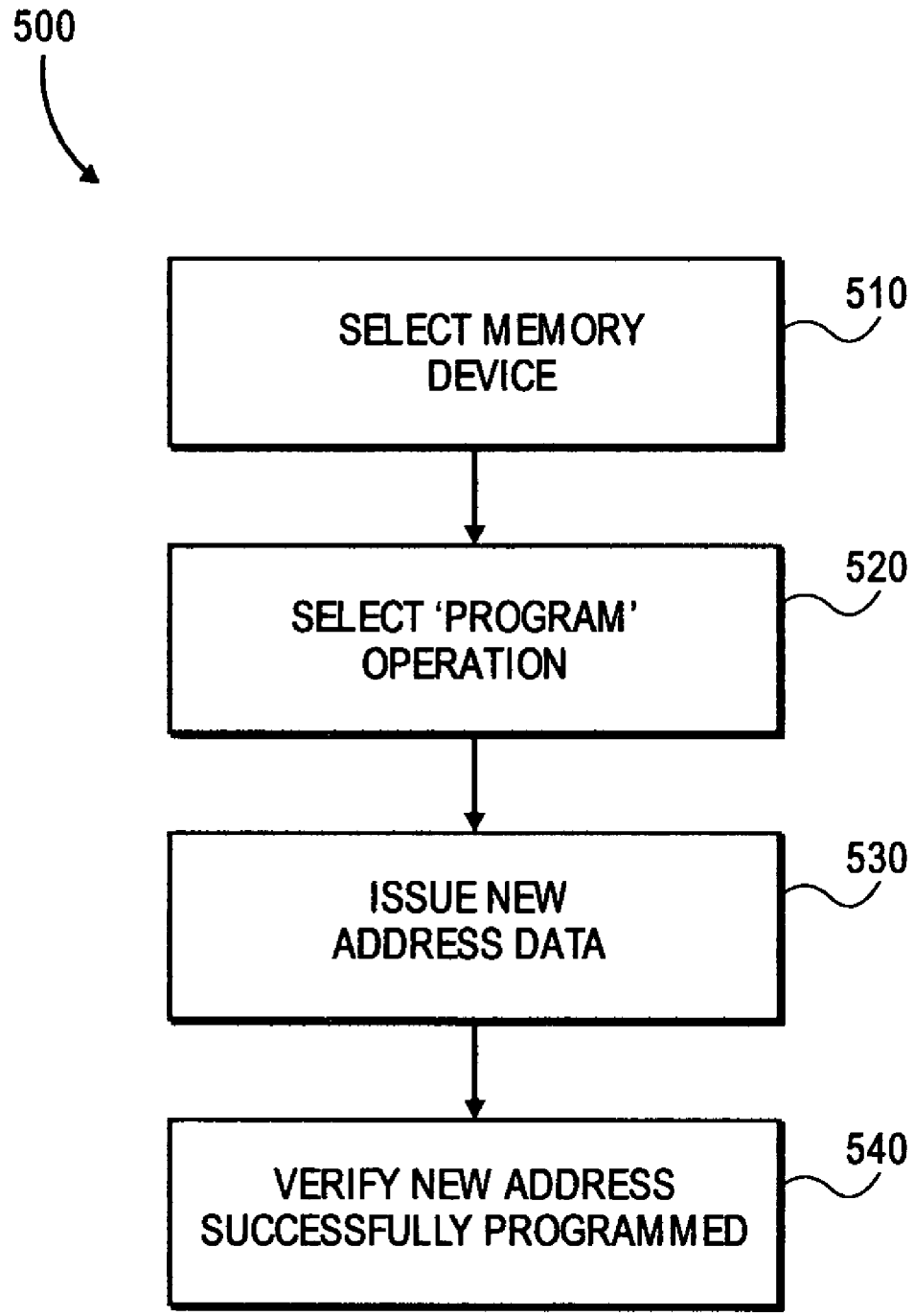
FIG. 5 shows a flow diagram of a method, according to an embodiment of the invention.

FIG. 5 shows a flow diagram of a method, according to an embodiment of the invention. In the illustrated flow diagram 500, a system may select a memory device for address programming. In some embodiments this may be done by issuing a selection command at 510 that the device will recognize, followed by an operation command at 520 directing the selected device to reprogram its address register. In other embodiments, a signal on a particular pin may cause the memory device to perform an address programming operation, combining both 510 and 520. Regardless of how the memory device is triggered to program its address register, the system may issue the new device address to the memory device over a connected bus at 530. In some embodiments, it may subsequently be necessary to verify that the memory device correctly programmed its address register, and that verification can be performed at 540. This may be accomplished in various ways. For example, the memory device may be given a command (or provided with a particular signal) directing it to read its address register and place the contents on the bus for verification. In another embodiment, the memory device may be issued a selection command using its new address, followed by an operation command directing it to place some recognizable data on the memory bus. If the memory device responds by writing data onto the bus, then its address register has been correctly reprogrammed.

The foregoing description is intended to be illustrative and not limiting. Variations will occur to those in the art. Those variations are intended to be included in the various embodiments of the invention, which are limited only by the spirit and scope of the following claims.

What is claimed is:

1. A method, comprising:
    issuing one or more signals to select a particular non-volatile memory device;
    directing the selected memory device to program an address register within the selected memory device;
    issuing an address to the selected memory device for the selected memory device to store in the address register; and
    verifying the address was correctly stored in the selected memory device;
    wherein the address stored in the memory device is to serve as a selection address for the memory device.

2. The method of claim 1, wherein said issuing one or more signals comprises issuing a selection command.

3. The method of claim 1, wherein said issuing one or more signals comprises asserting a programming signal.

4. The method of claim 1, wherein said directing comprises issuing a command to the non-volatile memory device.

5. The method of claim 4, wherein said command and said address are issued on a same set of input/output lines.

6. An article comprising
    a tangible machine-readable medium that contains instructions, which when executed by one or more processors result in performing operations comprising:
        issuing one or more signals to select a particular non-volatile memory device;
        directing the selected memory device to program an address register within the selected memory device;
        issuing an address to the selected memory device for the selected memory device to store in the address register; and
        verifying the address was correctly stored in the selected memory device;
        wherein the address stored in the memory device is to serve as a selection address for the memory device;
        wherein the operation of issuing one or more signals comprises asserting a programming signal.

7. The article of claim 6, wherein the operation of issuing one or more signals comprises issuing a selection command.

8. The article of claim 6, wherein the operation of directing comprises issuing a command to the non-volatile memory device.

9. The article of claim 6, wherein said command and said address are issued on a same set of input/output lines.

* * * * *